(12) United States Patent
Oikawa

(10) Patent No.: US 7,292,054 B2
(45) Date of Patent: Nov. 6, 2007

(54) IMPEDANCE MEASURING APPARATUS OF PACKAGE SUBSTRATE AND METHOD FOR THE SAME

(75) Inventor: Ryuichi Oikawa, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/377,195

(22) Filed: Mar. 17, 2006

(65) Prior Publication Data

US 2006/0220663 A1  Oct. 5, 2006

(30) Foreign Application Priority Data

Mar. 17, 2005 (JP) .............................. 2005-077946

(51) Int. Cl.
*G01R 27/08* (2006.01)
(52) U.S. Cl. ................................... 324/718
(58) Field of Classification Search ............... None
See application file for complete search history.

(56) References Cited

U.S. PATENT DOCUMENTS 6,518,743 B1 * 2/2003 Kodato .................. 324/95

2005/0258819 A1 * 11/2005 Hoshi et al. ............. 324/158.1

FOREIGN PATENT DOCUMENTS

| JP | 11-148951 | 6/1999 |
| JP | 2001-153909 | 6/2001 |
| JP | 2003-43091 | 2/2003 |

* cited by examiner

*Primary Examiner*—Vincent Q. Nguyen
(74) *Attorney, Agent, or Firm*—Young & Thompson

(57) ABSTRACT

An impedance measuring apparatus includes a plurality of RF (radio frequency) probes; a plurality of rotation mechanisms coupled to the plurality of RF probes, respectively; a processing unit, and a mechanical controller. The mechanical controller controls the plurality of rotation mechanisms and the plurality of RF probes to measure package RF signals between terminals formed on a package substrate. The processing unit measures calibration RF signals between terminals formed on at least one calibration substrate; determines RF impedances of the package substrate from the package RF signals and phase differences corresponding to a thickness of the package substrate and distances between the terminals on the package substrate from the calibration RF signals, and calibrates the RF impedances based on the phase differences.

19 Claims, 6 Drawing Sheets

IMPEDANCE MEASURING APPARATUS OF PACKAGE SUBSTRATE AND METHOD FOR THE SAME

BACKGROUND OF THE INVENTION

1. Field of the Invention

The present invention relates to an apparatus and method for measuring RF (radio frequency) impedance of a semiconductor package substrate.

2. Description of the Related Art

Operation speed of a semiconductor device has been increasing rapidly in recent years, and high frequency characteristics of a semiconductor package substrate have been improved accordingly on which the semiconductor device is mounted. During this progress, a new unexpected problem is caused in the measurement of RF impedance (S-parameter) of the semiconductor package substrate at a test adjustment stage, because of the demand of higher characterization frequency for the semiconductor package substrate.

FIG. 1 shows a conventional method for measuring the RF impedance (S-parameter) of a power source line in a package substrate 105. Referring to FIG. 1, a package substrate 105 is mounted on a substrate 110 such as a printed circuit board through solder balls. In this case, it is desired to measure the S-parameter between a power source terminal 107 on the upper (front) surface of the package substrate 105 and a power source terminal 106 on the back surface of the package substrate 105 by directly contacting an RF probe #2 103 and an RF probe #1 102 to the respective terminals. However, the back surface of the package substrate 105 is usually mounted on the printed circuit board. For this reason, it is impossible to contact the RF probe #1 102 directly to the back surface of the package substrate 105. Therefore, a signal probe 102a of the RF probe #1 102 is contacted to a power source terminal 108 on the mounting substrate 110 which is connected to the power source terminal 106 on the back surface of the power source terminal 105, and the RF impedance (S-parameter) is measured between the signal probes 102a and 103a of the RF probe #2 103 that is in contact with the power source terminal 107 on the upper surface of the package substrate 105. Another measurement is also carried out for the S-parameter of the power source line 112 on the mounting substrate 110. A GND probe 102b of the RF probe #1 102 is contacted with a GND terminal 109 on the printed circuit board 110, and a GND probe 103b of the RF probe #2 103 is contacted with a GND terminal 113 on the upper surface of the package substrate 105. Since the package substrate 105 and the mounting substrate 110 are connected in series, the S-parameters measured in the above manner are converted into Z-parameters so that the Z-parameter of the package substrate can be obtained as follows when the z-parameter of the package substrate 105, the z-parameter of the mounting substrate 110 and an overall Z-parameter are Z0, Z1, and Z, respectively.

$$Z = Z0 + Z1$$

Accordingly, $$Z0 = Z - Z1$$

Then, the Z-parameter Z0 is converted into an S or Y-parameter as needed, and an equivalent circuit is extracted.

In conjunction with the above description, Japanese Laid Open Patent Application (JP-P2003-43091A) discloses a substrate testing apparatus. In this conventional example, the substrate testing apparatus measures a resistance value of an interconnection net between a bump provided on the front surface of a substrate and a terminal provided on the back surface of the substrate by using a four-terminal method.

Also, Japanese Laid Open Patent Application (JP-P2001-153909A) discloses a substrate testing apparatus, a substrate manufacturing method, and a substrate with bump. In this conventional example, the substrate testing apparatus includes a plurality of first terminal portions arrayed and formed in 2-dimensional manner on one of substrate planes of a substrate body. A plurality of second terminal portions corresponding to the first terminal portions are arrayed and formed in the 2-dimensional manner on the other substrate plane of the board body. The first terminal portions are respectively connected to the corresponding second portions by using an interconnection net including via-contacts. The substrate testing apparatus includes an electrical current probe set and a voltage measuring probe set. In the above sets, a first measuring probe group has a plurality of first measuring probes arranged in the 2-dimensional manner and detachably contacting the first terminal portions. In an electrical current probe set and a voltage measuring probe set, a second measuring probe is selectively and detachably made to contact any of the second terminal portions. The first measuring probe group is connected with the first terminal portions and the second measuring probe is connected with the second terminal portion corresponding to the interconnection net as a measurement target. In this state, measurement current is supplied to the interconnection net from the electric current probe set, and a data reflecting a resistance value specific to the interconnection net is generated based on an applied voltage to the interconnection net measured by the voltage measuring probe set. The generated data is compared with a reference data defined for the interconnection net and the interconnection net is determined based on the comparing result.

Also, Japanese Laid Open Patent Application (JP-A-Heisei 11-148951A) discloses a substrate testing apparatus, a substrate manufacturing method, and a substrate with bumps. In the substrate testing apparatus of this conventional example, a printed circuit board is provided with electrodes connected a power source and ground of a semiconductor device mounted on the printed circuit board, and a high frequency connector, and the high frequency connector and the electrodes are connected by interconnections.

SUMMARY OF THE INVENTION

When an object to be measured is a signal line on the package substrate, because Z0 and Z1 have similar value, the impedance (S-parameter) of the signal line can be calculated with sufficient accuracy within a limited frequency range that is not high. However, when the frequency of a signal for the measurement is high, a distance shown in FIG. 1 between the power source terminals 108 and 107 respectively connected to the RF probe #1 102 and the RF probe #2 103 due to the height of the package substrate 105 is not negligible. There will be a problem of the distance, i.e., a reference plane difference 101 when the measurement is carried out. Usually, in the measurement of the RF impedance (S-parameter), a calibration substrate made of ceramics is used to correct a phase difference of an electromagnetic wave and a transmission loss thereof between the reference planes connected to the RF probes. The calibration substrate is a flat board, and two RF probes (RF probe #1

102 and RF probe #2 103) shown in FIG. 1 are regarded as being on the same position of the plane for calibration.

However, there is an electric distance as the reference plane difference 101 due to the thickness of the package substrate 105 between the two RF probes (RF probe #1 102 and RF probe #2 103) as shown in FIG. 1. Therefore, the electric distance causes a phase difference, a loss and a measurement error. Generally, in order to measure the RF impedance with sufficient accuracy, it is necessary to set the phase difference of the signal to less than 1/20 of the wavelength of the signal used for the measurement.

An average dielectric constant of a standard FCBGA (Flip Chip Ball Grid Array) package is about "4" and the height (distance) of the package substrate is about 2 mm from the surface of the package substrate to the surface of the mounting substrate (printed circuit board). Thus, the frequency to satisfy 1/20 of the wavelength is less than 3.75 GHz. Accordingly, a sufficiently accurate measurement with the measurement method shown in FIG. 1 can be carried out in the frequency bandwidth of about 4 GHz or less.

Further, when the object to be measured in FIG. 1 is a power source/GND line, there will be a larger measurement error in a lower frequency range. The RF impedance of the power source/GND line is considerably small as follows.

$$Z0 \ll Z1$$

Accordingly, $$Z = Z0 + Z1 \sim Z1$$

When calculating the impedance Z0 of the package substrate from the measured value, there will be considerably large error in the value as follows.

$$Z0 = Z - Z1 \sim 0$$

As described above, in order to measure the RF impedance in the GHz frequency range, a measuring apparatus is needed in which it is possible to contact the RF probes directly to both front and back surfaces of the package substrate simultaneously and which has means of calibrating the phase difference in the thickness direction or within the same plane of the package substrate.

Since the conventional substrate testing apparatus does not has a function required for the RF impedance measuring apparatus, it is impossible to use the substrate testing apparatus as the RF impedance measuring apparatus as it is. In order to use the apparatus as the RF impedance measuring apparatus, it is necessary to include, for example, an RF probe, a fine driving mechanism, an RF signal line adjusted to 50 Ω or the like (cable, connector, attenuator, circulator, network analyzer, or the like), an RF calibration substrate or the like. Further, arrayed measuring terminal groups may cause RF interference each other. Therefore, it is difficult to measure the RF impedance by the arrayed measuring terminal groups.

From the above situation, in an aspect of the present invention, an impedance measuring apparatus includes a plurality of RF (radio frequency) probes; and a processing unit configured to measure package RF signals between terminals formed on a package substrate, to measure calibration RF signals between terminals formed on at least one calibration substrate, to determine RF impedances of said package substrate from the package RF signals, and phase differences corresponding to a thickness of the package substrate and distances between the terminals on the package substrate from the calibration RF signals, and to calibrate said RF impedances based on the phase differences.

Here, the impedance measuring apparatus may further include a plurality of rotation mechanisms coupled to the plurality of RF probes, respectively; and a mechanical controller configured to control the plurality of rotation mechanisms and the plurality of RF probes to measure the package RF signals and the calibration RF signals.

Also, each of the plurality of rotation mechanisms may be a 90-degree rotating mechanism. The impedance measuring apparatus may include first to fourth RF probes; and first to fourth rotation mechanisms. The mechanical controller may control the first and second rotation mechanisms and the first and second probes such that the first and second probes contact two terminals of a front surface of the package substrate which is provided horizontally, and the third and fourth rotation mechanisms and the third and fourth probes such that the third and fourth probes contact two terminals of a back surface of the package substrate. The processing unit may measure the package RF signals from the first to fourth RF probes while sequentially supplying an RF signal from each of the first to fourth RF probes. The mechanical controller may control the first to fourth rotation mechanisms such that the first and fourth rotation mechanisms are rotated by 90 degrees in a clockwise direction and the second and third rotation mechanisms are rotated by 90 degrees in a counter-clockwise direction. The processing unit may measure the calibration RF signals corresponding to the thickness of the package substrate by using two calibration substrates which are provided vertically. The mechanical controller may control the first to fourth rotation mechanisms such that the first and fourth rotation mechanisms are rotated by 90 degrees in the counter-clock wise direction and the second and third rotation mechanisms are rotated by 90 degrees in the clockwise direction. The processing unit may measure the calibration RF signals corresponding to the distances between the four terminals on the front and back surfaces of the package substrate by using two calibration substrates which are provided horizontally, may determine RF impedances of the package substrate from the package RF signals, may calculate the phase differences corresponding to the thickness of the package substrate and the distances between the four terminals on the package substrate from the calibration RF signals, and may calibrate the RF impedance based on the phase differences.

Also, each of the plurality of rotation mechanisms may be a 180-degree rotating mechanism. The impedance measuring apparatus may include first and second RF probes; and first and second rotation mechanisms. The mechanical controller may control the first and second rotation mechanisms and the first and second probes such that the first and second probes contact first and second terminals of a front surface of the package substrate which is provided horizontally. The processing unit may measure the package RF signals between the first and second terminals. The mechanical controller may control the first rotation mechanism and the first probe such that the first probe contacts a third terminal of a back surface of the package substrate which is provided horizontally. The processing unit may measure the package RF signals between the third and second terminals. The mechanical controller may control the second rotation mechanism and the second probe such that the second probe contacts a fourth terminal of the back surface of the package substrate which is provided horizontally. The processing unit may measure the package RF signals between the third and fourth terminals. The mechanical controller may control the first rotation mechanism and the first probe such that the first probe contacts the first terminal of the front surface of the package substrate which is provided horizontally. The processing unit may measure the package RF signals between the first and fourth terminals. The mechanical controller may control the first and second rotation mechanisms and the first and second probes such that the first and second probes contact first and second terminals of a front surface of the calibration substrate which is provided horizontally. The processing unit may measure the calibration RF signals between the first and second terminals. The mechanical controller may control the first rotation mechanism and the first probe such that the first probe contacts a third terminal of a back surface of the calibration substrate which is provided horizontally. The processing unit may measure the calibration RF signals between the third and second terminals. The mechanical controller may control the second rotation mechanism and the second probe such that the second probe contacts a fourth terminal of the back surface of the calibration substrate which is provided horizontally. The processing unit may measure the calibration RF signals between the third and fourth terminals. The mechanical controller may control the first rotation mechanism and the first probe such that the first probe contacts the first terminal of the front surface of the calibration substrate which is provided horizontally. The processing unit may measure the calibration RF signals between the first and fourth terminals, may determine RF impedances of the package substrate from the package RF signals, may calculate the phase differences corresponding to the thickness of the package substrate and the distances between the first and fourth terminals on the package substrate from the calibration RF signals, and may calibrate the RF impedances based on the phase differences.

In this case, the impedance measuring apparatus may further include a base; two support mechanisms 2-dimensionally movable provided on the base; two rotation mechanisms provided for each of the two support mechanisms; and two RF (radio frequency) probes provided for each of the two rotation mechanisms.

In another aspect of the present invention, a method of measuring RF (radio frequency) impedances is achieved by measuring package RF signals between terminals formed on front and back surfaces of a package substrate; by measuring calibration RF signals between terminals formed on front and back surfaces of at least one calibration substrate; by determining RF impedances of the package substrate from the package RF signals; by determining phase differences corresponding to a thickness of the package substrate and distances between the terminals on a front or back surface of the package substrate from the calibration RF signals; and by calibrating the RF impedances based on the phase differences.

Here, the measuring package RF signals is achieved by rotating first and second rotation mechanisms by 90 degrees such that first and second probes contact two of the terminals on the front surface of the package substrate which is provided horizontally, and the third and fourth probes contact two of the terminals on the back surface of the package substrate; and by measuring the package RF signals from the first to fourth RF probes while sequentially supplying an RF signal from each of the first to fourth RF probes.

In this case, the measuring calibration RF signals may be achieved by rotating the first to fourth rotation mechanisms such that the first and fourth rotation mechanisms are rotated by 90 degrees in a clockwise direction and the second and third rotation mechanisms are rotated by 90 degrees in a counter-clockwise direction; by measuring the calibration RF signals corresponding to the thickness of the package substrate by using two calibration substrates which are provided vertically; by rotating the first to fourth rotation mechanisms such that the first and fourth rotation mechanisms are rotated by 90 degrees in the counter-clockwise direction and the second and third rotation mechanisms are rotated by 90 degrees in the clockwise direction; and by measuring the calibration RF signals corresponding to the distances between the four terminals on the front and back surfaces of the package substrate by using two calibration substrates which are provided horizontally.

Also, the measuring package RF signals may be achieved by (a) rotating first and second rotation mechanisms such that first and second probes contact first and second terminals of the terminals on the front surface of a target substrate which is provided horizontally; by (b) measuring RF signals between the first and second terminals; by (c) rotating the first rotation mechanism such that the first probe contacts a third terminal of the terminals on the back surface of the target substrate which is provided horizontally; by (d) measuring RF signals between the third and second terminals; by (e) rotating the second rotation mechanism such that the second probe contacts a fourth terminal of the terminals on the back surface of the target substrate which is provided horizontally; by (f) measuring RF signals between the third and fourth terminals; by (g) rotating the first rotation mechanism such that the first probe contacts the first terminal on the front surface of the target substrate which is provided horizontally; by (h) measuring RF signals between the first and fourth terminals; and by (i) carrying out the steps (a) to (h) by using the package substrate as the target substrate to get the RF signals as the package RF signals.

In this case, the measuring calibration RF signals may be achieved by (j) carrying out the steps (a) to (h) by using the calibration substrate as the target substrate to get the RF signals as the calibration RF signals.

In another aspect of the present invention, an impedance measuring apparatus corrects phase differences in a direction of a thickness of a package substrate and in a same plane, and measures impedance between terminals formed on front and back surfaces of the package substrate. The impedance measuring apparatus includes a plurality of RF probes; and a plurality of rotation mechanisms. The plurality of RF probes are connected with the plurality of rotation mechanisms and measure the impedance between the terminals formed on the front and back surfaces of the package substrate on a first rotation position, and measure the phase differences corresponding to distances between the terminals in the direction of the thickness of the package substrate and in the same plane of the package substrate by using RF calibration substrates arranged in a vertical direction or in a horizontal direction to a arrangement direction of the package substrate in the first rotation position and a second rotation position. The impedance value is calibrated based on the phase differences.

Here, the rotation mechanisms may be rotatable within a 90-degree range.

Also, the plurality of RF probes measure the impedance between the terminals formed on the front and back surfaces of the package substrate on a first rotation position or a second rotation position, and measure the phase differences corresponding to distances between the terminals in the direction of the thickness of the package substrate and in the same plane of the package substrate by using RF calibration substrates arranged in a vertical direction or in a horizontal direction to a arrangement direction of the package substrate in the first rotation position, a second rotation position, a third rotation position, and a fourth rotation position.

In this case, the rotation mechanisms may be rotatable in a 180-degree range.

Also, the plurality of RF probes are arranged on a 3-dimensional scale and are removable. The distances corresponding to inter-pin distances in the direction of the thickness of the package substrate and in the same plane between the plurality of RF probes by the 3-dimensional scale are measured.

Also, the impedance measuring apparatus may further include a RF measurement unit configured to carry out the calibration and the measurement of the RF impedance.

DESCRIPTION OF THE PREFERRED EMBODIMENTS

Hereinafter, an impedance measuring apparatus for a package substrate according to the present invention will be described in detail with reference to the attached drawings.

First Embodiment

Figure 1:
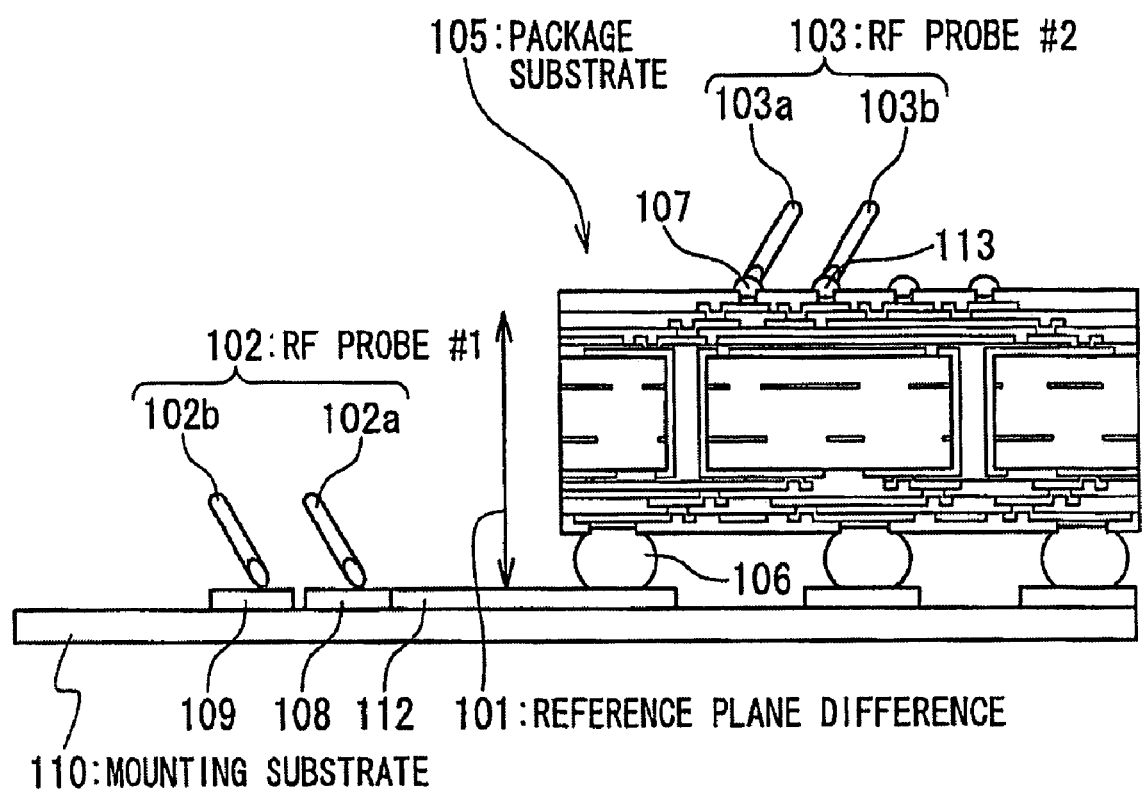
FIG. 1 is a principle view showing a conventional measurement method.
Figure 2:
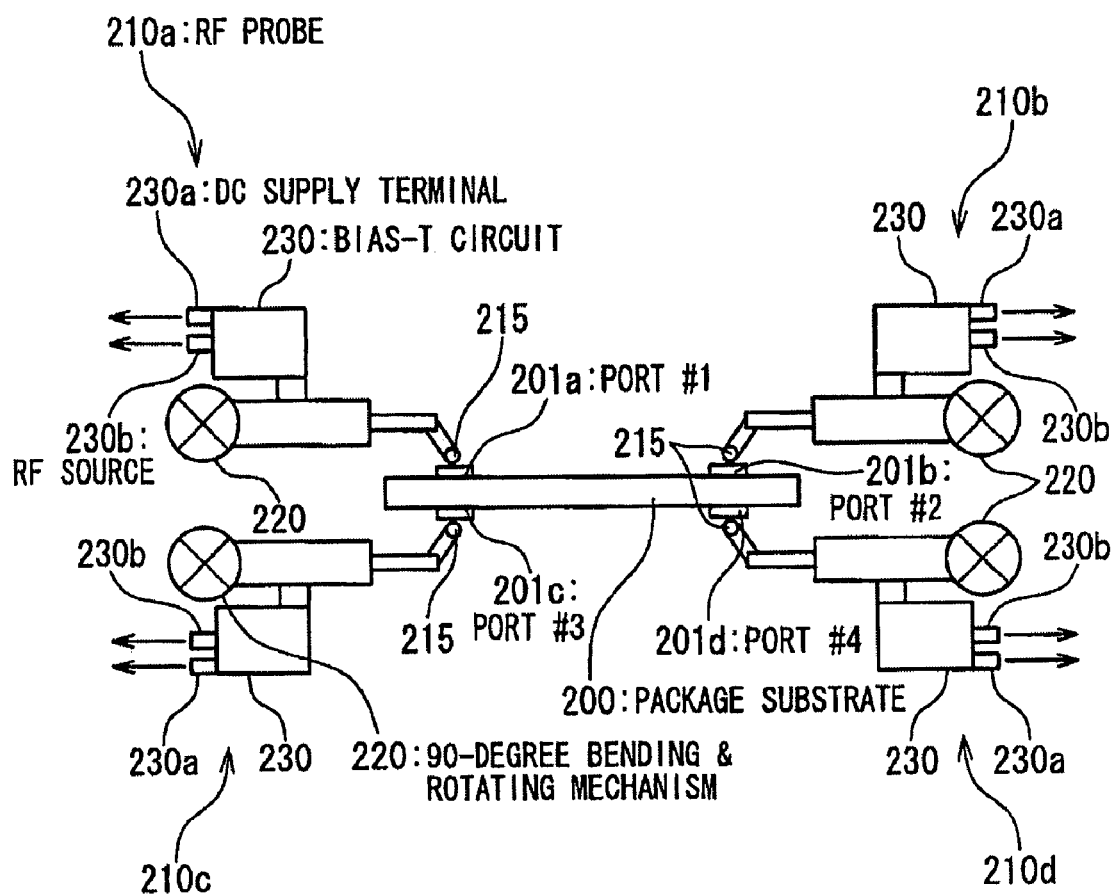
FIG. 2 is a cross sectional view schematically showing a structure of an impedance measuring apparatus according to a first embodiment of the present invention.

FIG. 2 is a cross sectional view schematically showing the structure of the impedance measuring apparatus according to the first embodiment of the present invention when a package substrate 200 as a measurement target is measured.

The impedance measuring apparatus in the first embodiment includes a processing unit (not shown) containing a network analyzer (not shown) and carrying out a calibration calculation, four RF (radio frequency) probes 210a to 210d, a 90-degree bending & rotating mechanism 220 connected to each of the RF probes 210a to 210d, a calibration substrate supporting mechanism 250 to support calibration substrates 240 (FIG. 3) in a horizontal or vertical state, and a mechanical controller (not shown). The mechanical controller (not shown) controls the rotation mechanisms 220 to be rotated.

Each of the RF probes 210a to 210d includes a DC supply terminal 230a, a Bias-T circuit 230 and a signal probe 215. The DC supply terminal 230a receives a DC voltage from the external power supply and sends it to the Bias-T circuit 230. The Bias-T circuit 230 receives an RF signal from the processing unit and synthesizes the RF signal and the DC voltage to supply to a substrate through the signal probe 215. Also, the Bias-T circuit 230 sends the RF signal received through the signal probe 215 to the processing unit. The signal probe 215 is used to measure RF impedance (S-parameter). The signal probes 215 are made to contact the terminals 201a to 210d formed on the front and back surfaces of the package substrate 200. The RF signal is supplied from the signal probe 215 of the RF probe 210a and measured by the signal probes 215 of the RF probes 210a to 210d, and then are sent to the processing unit through the Bias-T circuits 230.

A similar operation is carried out by using calibration substrates, and the measured result about the calibration substrates are sent to the processing unit. The processing unit calculates a phase difference for each of the terminals 201a to 201d and corrects the RF impedances obtained from the package substrate 200 based on the calculated phase differences. Thus, the correct RF impedances can be obtained. It should be noted that a GND probe is omitted in the figure. Also, each of the RF probes 210a to 210d is coupled to the 90-degree bending & rotating mechanism 220, so that the RF probe is rotated in phase calibration between the terminals to contact a reference line on the RF calibration substrate 240 that is disposed in parallel or perpendicular to the package substrate 200.

Figure 3:
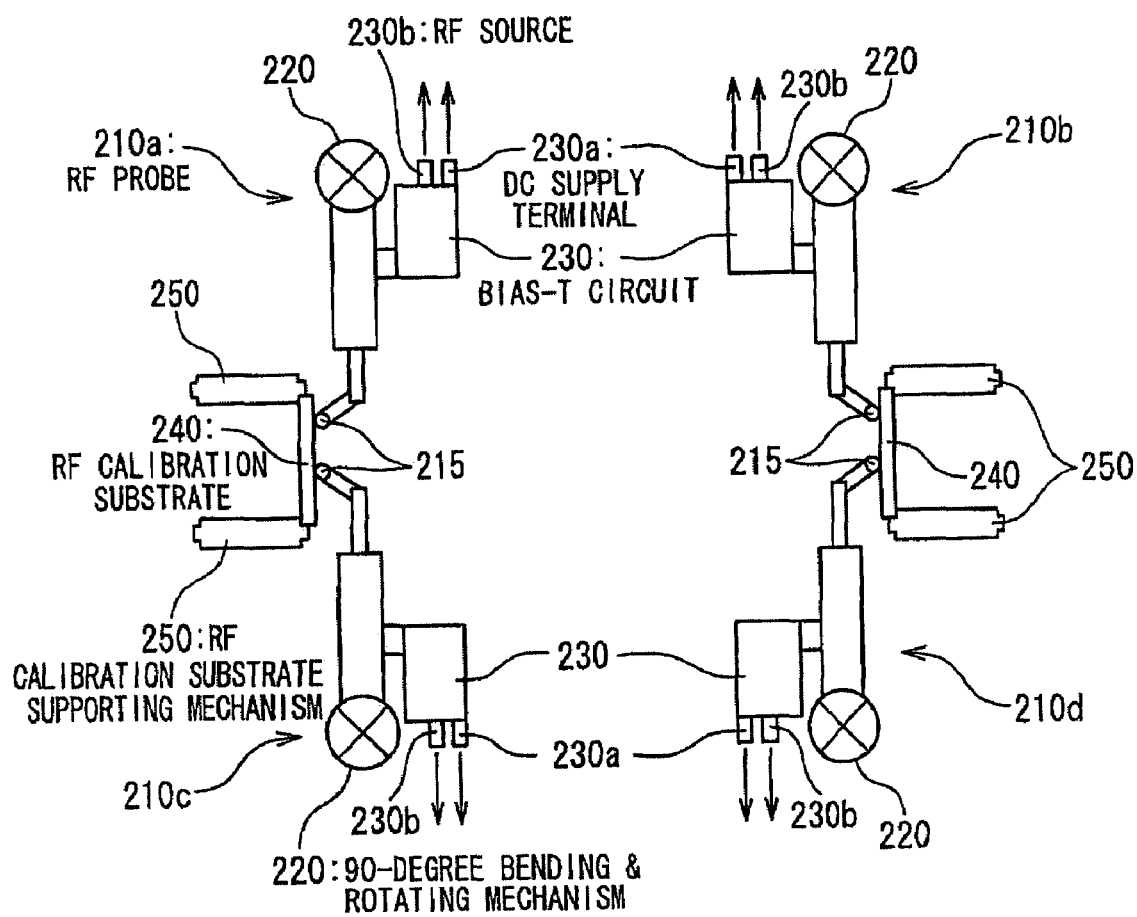
FIG. 3 is a cross sectional view schematically showing an operation on calibration in the impedance measuring apparatus according to the first embodiment of the present invention.
Figure 4:
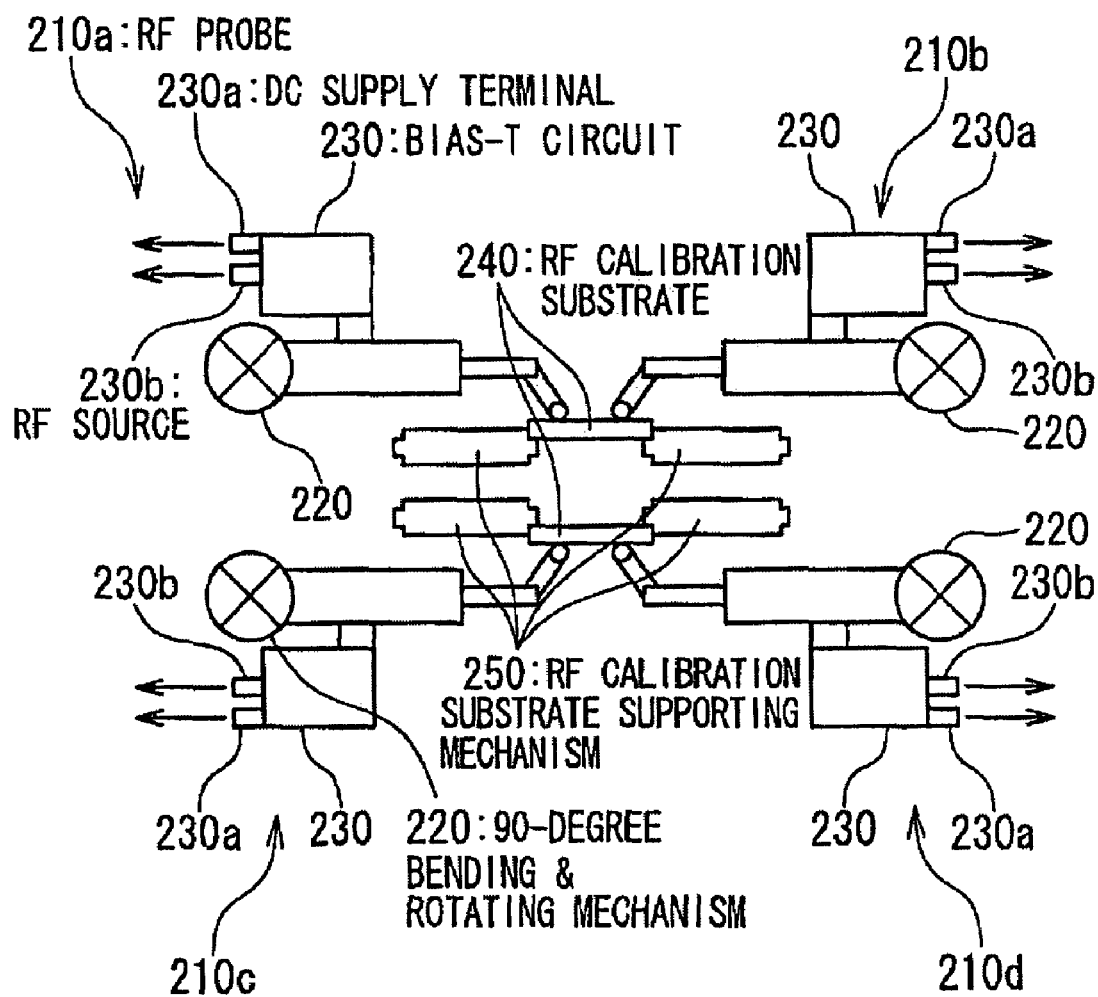
FIG. 4 is a cross sectional view schematically showing another operation on the calibration in the impedance measuring apparatus according to the first embodiment of the present invention.

In this embodiment, when the RF impedances (S-parameters) are to be measured, the package substrate 200 is disposed in a horizontal state as shown in FIG. 2. Also, when the phase differences between the RF signal lines are calculated, the calibration substrates 240 are disposed in a vertical state and a horizontal state to the package substrate 200 by using the RF calibration substrate supporting mechanisms 250, as shown in FIGS. 3 and 4.

Next, an operation of the impedance measuring apparatus in this embodiment will be described below.

Firstly, as shown in FIG. 2, when the package substrate 200 is disposed in the horizontal state, the signal probes 215 of the RF probes 210a to 210d are respectively brought into contact with the terminals 2001a to 201d as described above. Thus, preparation of measurement of the RF impedance (S-parameter) is completed between the respective terminals 201a to 210d on the front and back surfaces of the package substrate 200. The signal probes 215 of the RF probes 210a to 210d are respectively connected to ports of the processing unit (not shown) containing the network analyzer, and an initial calibration is carried out in the ports of the processing unit before actually measuring the RF impedances. When the measurement is carried out, it is necessary to correct the phase differences between the signal probes 215 since each port is regarded as being disposed on the same reference plane. Details of the phase difference correction will be described later.

When the signal probes 215 of the RF probes 210a to 210d are in contact with the terminals 201a to 210d, the RF signals start to be measured between the terminals 201a to 210d by using the processing unit. For the sake of convenience, it is supposed that the terminal 201a is a port 1, the terminal 201b is a port 2, the terminal 201c is a port 3 and the terminal 201d is a port 4. In the measurement, the processing unit sequentially supplies the RF signal to each of the RF probes 210a to 210d and receives the measured results from the RF probes 210a to 210d. The transmission loss/transmission gain (S12, S13, S14, S21, S23, S24, S31, S32, S34 or the like) and the reflectance (S11, S22, S33, S44) are measured which are the RF impedances (S-parameter) between the terminals.

When the RF impedances of the package substrate 200 (S-parameters) are determined, the thickness of the package substrate 200, the distance between the terminals 201a and 201b on the front surface of the package substrate 200 and the distance between the terminals 201c and 201d on the back surfaces of the package substrate 200 are measured previously. When the determination of the RF impedances is completed, the package substrate 200 is removed and the RF calibration substrates 240 are disposed in the vertical state by using the RF calibration substrate supporting mechanisms 250, as shown in FIG. 3. The 90-degree bending & rotating mechanisms 250 are controlled by the mechanical controller (not shown) to rotate the RF probes 210a to 210d by 90 degrees around the rotary shaft of the 90-degree bending & rotating mechanisms 250 such that the signal probes 215 provided in the RF probes 210a to 210d are brought into contacted with reference lines on the calibration substrates. At this time, the RF probes 210a to 210d are moved in the vertical direction, to adjust the distances between the contact points of two signal probes 215 of the RF probes 210a and 210c; and 210b and 210d to the measured thickness of the package substrate 200. Then, the RF signals are measured between the signal probes 215 in this state to measure the phase difference corresponding to the thickness of the package substrate 200, and the measured results are sent to the processing unit as a first result data. In order to determine the phase difference on the same surface of the package substrate 200, e.g., the phase difference between the port 1 and the port 2, or between the port 3 and the port 4, the distances are measured between points corresponding to the terminals 201a and 201b (between the port 1 and the port 2) on the front surface of the package substrate 200 or between the terminals 201c and 201d (between the port 3 and the port 4) on the back surfaces of the package substrate 200, as described above.

Next, as shown in FIG. 4, the RF calibration substrates 240 are automatically or manually disposed in the horizontal state by using the RF calibration substrate supporting mechanisms 250. The 90-degree bending & rotating mechanisms 250 are controlled to rotate the RF probes 210a to 210d by 90 degrees around the rotary shaft such that the signal probes 215 of the RF probes 210a to 210d are brought into contacted with reference lines on the calibration substrates. At this time, the RF probes 210a to 210d can be moved in the horizontal direction. Therefore, the distance between the signal probes 215 of the RF probes 210a and 210b, and 210c and 210d is adjusted to be equal to the distance previously measured between the terminals 201a and 201b (between the port 1 and the port 2) on the front surface of the package substrate 200 and between the terminals 201c and 201d (between the port 3 and the port 4) on the back surface on the package substrate 200. The RF signal is supplied between the terminals to measure the phase differences between the terminals 201a and 201b (between the port 1 and the port 2) on the front surface of the package substrate 200 and between the terminals 201c and 201d (between the port 3 and the port 4) on the back surface of the package substrate 200, and the measured results are sent to the processing unit as the second result data. The processing unit determines the phase differences based on the first and second result data. Then, the processing unit corrects the RF impedances (S-parameters) obtained through the measurement of the package substrate 200 based on the phase differences determined by the processing unit. Thus, the measurement accuracy can be improved. It should be noted that when the phase differences are determined, the measurements of the package substrate 200 may be carried out by using one pair of the RF probes in the perpendicular direction and in the horizontal direction.

In the first embodiment, the RF probes 210a to 210d are brought into contact directly with the front and back surfaces of the package substrate 200. Also, through the rotation of the RF probes 210a to 210d by the 90-degree bending & rotating mechanisms 220, the measurement of the RF impedances of the package substrate 200 and the correction of the phase differences can be carried out. As a result, the measurement of the RF impedances (S-parameters) (especially, of the power source/GND lines) can be carried out with higher accuracy to the high frequency range, for example about 20 GHz. Therefore, an equivalent circuit can be generated with higher accuracy and a simulation model can adapt to high-speed operation of an LSI.

Second Embodiment

Figure 5:
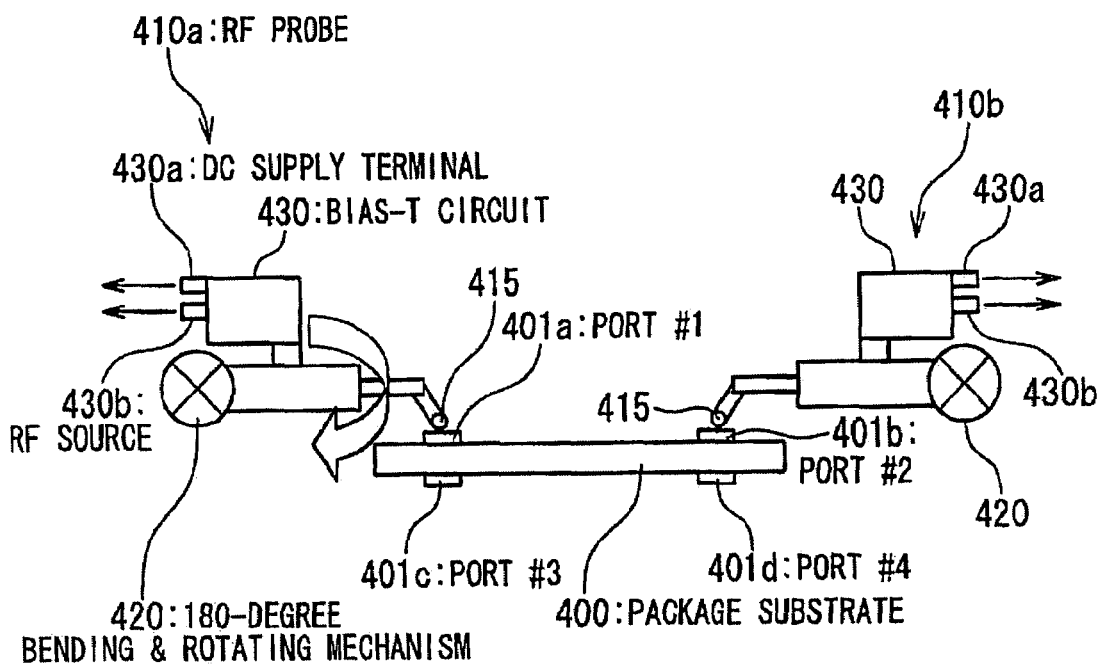
FIG. 5 is a cross sectional view schematically showing a structure of the impedance measuring apparatus according to a second embodiment of the present invention.
Figure 6:
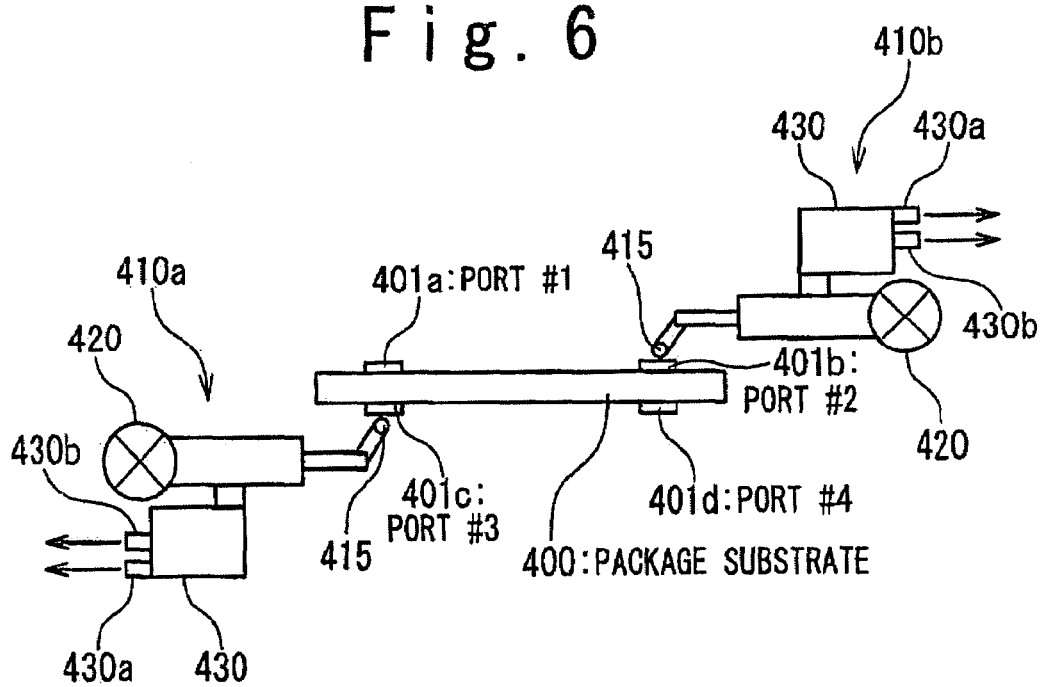
FIG. 6 is a cross sectional view schematically showing an operation of the impedance measuring apparatus according to the second embodiment of the present invention.

FIGS. 5 and 6 are diagram schematically showing the impedance measuring apparatus of the package substrate according to the second embodiment of the present invention. The basic configuration and operation principle of the impedance measuring apparatus in the second embodiment are the same as those in the first embodiment. However, a 180-degree bending & rotating mechanism 420 is provided in the second embodiment instead of the 90-degree bending & rotating mechanism 250.

The RF impedance measuring apparatus in the second embodiment includes two RF probes 410a and 410b, and the above-mentioned 180-degree bending & rotating mechanisms 420. Each of the RF probes 410a and 410b includes a DC supply terminal 430a to receive a DC bias, and a Bias-T circuit 430 to receive and combine the DC bias from the DC supply terminal 430a and an RF signal from the processing unit (not shown), and a signal probe 415. The Bias-T circuit 430 supplies the combined RF signal to a substrate through the signal probe 415 and receives an RF output signal to send to the processing unit. The processing unit receives the RF output signals and determines the phase differences based on the RF output signal on the calibration substrate. Then, the processing unit corrects the RF impedances (S-parameters) between terminals 401a to 401d of the package substrate 400 based on the determined phase differences. In the above measurement, the RF probes 410a and 401b are rotated by the 180-degree bending & rotating mechanisms 420.

Next, the operation of the impedance measuring apparatus in this embodiment will be described. Firstly, when the package substrate 400 is disposed in the horizontal state as shown in FIG. 5, the signal probes 415 of the RF probes 410a and 410b are brought into contact with the terminals 401a and 401b respectively as described above. Thus, preparation of measurement of the RF impedances (S-parameters) between the terminals 401a and 401b on the front surface of the package substrate 400 is completed. The RF signal is supplied from the processing unit to the signal probe 415 of the RF probes 410a and the measured RF signals are sent to the processing unit from the RF probes 410a and 410b. Also, the RF signal is supplied from the processing unit to the signal probe 415 of the RF probes 410b and the measured RF signals are sent to the processing unit from the RF probes 410a and 410b. Next, the RF probe 410a is rotated by the 180-degree bending & rotating mechanism 420 and the signal probe 415 of the RF probe 410a is connected to the terminal 401c on the back surface of the package substrate 400. Then, the measurement of the RF impedances (S-parameters) between the terminals 401c and 401b is carried out in the same way as described above. Next, the RF probe 410b is rotated by the 180-degree bending & rotating mechanism 420 and the signal probe 415 of the RF probe 410b is connected to the terminal 401d on the back surface of the package substrate 400. Then, the measurement of the RF impedances (S-parameters) between the terminals 401c and 401d is carried out in the same way as described above. Next, the RF probe 410a is rotated by the 180-degree bending & rotating mechanism 420 and the signal probe 415 of the RF probe 410b is connected to the terminal 401a on the back surface of the package substrate 400. Then, the measurement of the RF impedances (S-parameters) between the terminals 401a and 401d is carried out in the same way as described above. Through the above measurement, the RF impedances (S-parameters) of the package substrate 400 are determined by the processing unit.

Next, the package substrate is replaced by the calibration substrate, and then the same measuring operation as described above is carried out to the calibration substrate. The processing unit determines the phase differences from the measurement results on the calibration substrate, and corrects the RF impedances (S-parameters) based on the determined phase differences.

In the second embodiment, by employing the 180-degree bending & rotating mechanisms 420, the number of the RF probes required for measuring the RF impedances (S-parameters) between all the ports on the package substrate 200 can be reduced from four in the first embodiment to two. In other words, the RF probes 210a and 210c in the first embodiment can be replaced by the RF probe 410a, and the FR probes 210b and 210d in the first embodiment can be replaced by the RF probe 410b in the second embodiment.

In addition to the operational effects presented in the first embodiment, the second embodiment can achieve the measurement of the RF impedances (S-parameters) between the four ports by using only the two RF probes 410a and 410b instead of the four RF probes 210a to 210d required in the first embodiment through the rotation of the RF probes 410a and 410b by the 180-degree bending & rotating mechanism 420. Therefore, the second embodiment can provide the impedance measuring apparatus with a structure more simplified than the first embodiment. The reduction of the number of the RF probes also simplifies the operation of the RF impedance measuring apparatus.

Third Embodiment

Figure 7:
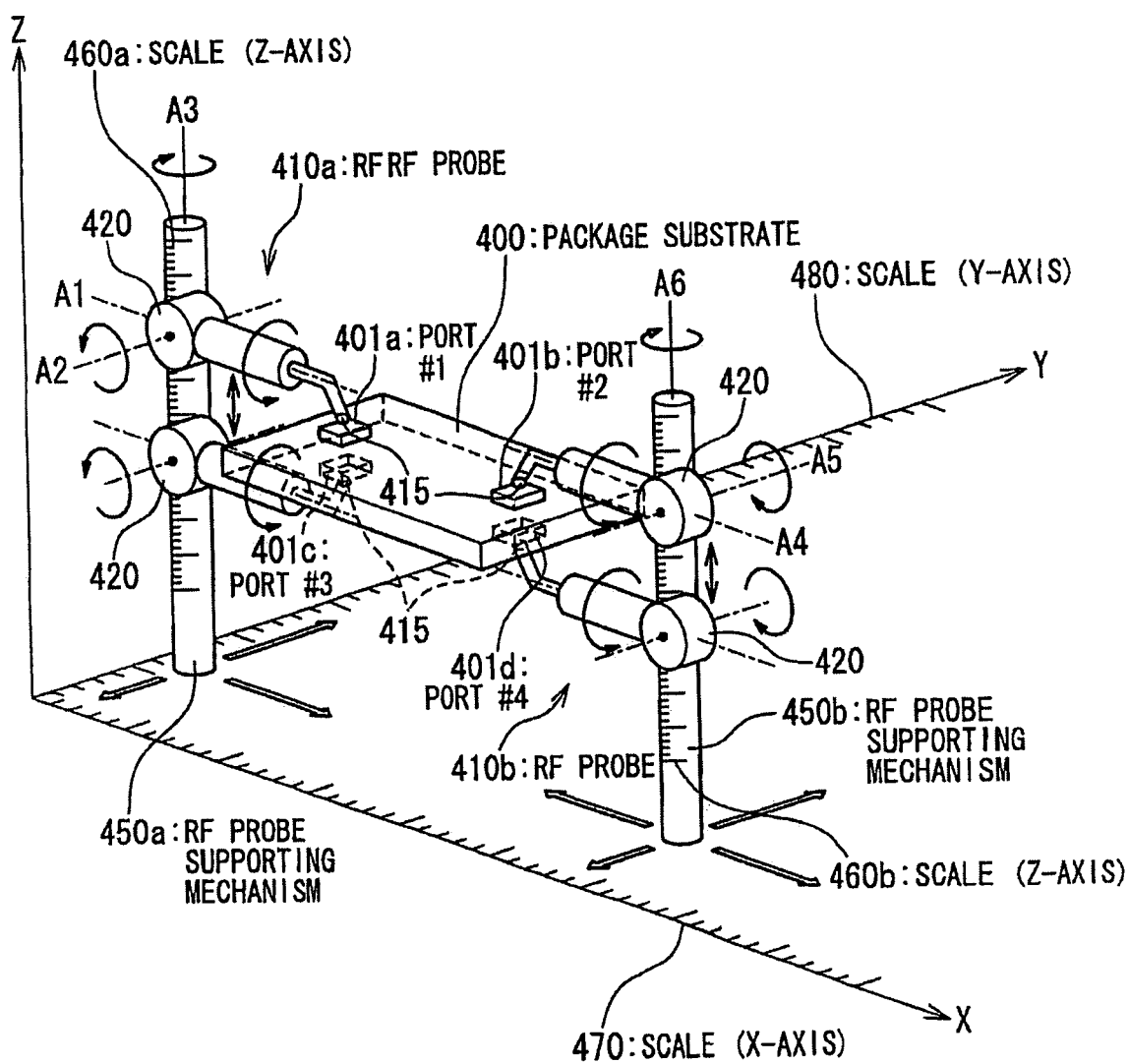
FIG. 7 is a diagram schematically showing a structure of the impedance measuring apparatus according to a third embodiment of the present invention.

FIG. 7 is a diagram schematically showing the RF impedance measuring apparatus of a package substrate according to the third embodiment of the present invention. The basic structure and measurement principles in the third embodiment are the same as those the second embodiment. However, the third embodiment includes scales for accurately measuring the position coordinates of RF probes 410a and 410b with respect to the three axis directions as shown in FIG. 7. Thus, the thickness (in Z direction) of the package substrate 400 and the distance between ports in within the same plane (XY plane) of the package substrate 400 can be accurately measured, thereby the phase correction can be carried out promptly and easily.

The RF impedance measuring apparatus of the third embodiment includes two RF probes 410a and 410b, two RF probe supporting mechanisms 450a and 450b to support the two RF probes 410a and 410b, and the 180-degree bending & rotating mechanism 420. As shown in FIG. 7, the RF probe supporting mechanisms 450a and 450b are movable into the X axis and Y axis directions within a XY plane.

Since a scale (X axis) 470 and a scale (Y axis) 480 are respectively provided in the X axis and Y axis directions, the X and Y coordinates of the RF probe supporting mechanisms 450a and 450b, namely, the X and Y coordinates of the signal probes 415 of the RF probes 410a and 410b can be promptly obtained. Also, scales 460a (Z axis) and 460b (Z axis) are provided in the RF probe supporting mechanisms 450a and 450b respectively to measure the position coordinates of the RF probe 410a and 410b in the Z axis direction. Therefore, the position coordinates of the terminals 415 of the RF probes 410a and 410b can be promptly obtained in the Z axis direction.

Next, the operation principle of the RF impedance measuring apparatus in the present embodiment will be described. Firstly, when the package substrate 400 as a measurement object is disposed in the horizontal state as shown in FIG. 7, the signal probes 415 of the RF probes 410a and 410b are brought into contact with two of the terminals 401a to 401d as described above. Thus, preparation of measurement of the RF impedance (S-parameter) is completed between the two optional ports of the terminals 401a to 401d on the surfaces of the package substrate 400. The signal probes of the RF probes are respectively connected to ports of a processing unit (not shown) such as a network analyzer, and the initial calibration is carried out in the ports of the processing unit before actually measuring the RF impedance. When the measurement is carried out by contacting the measuring probes to different reference planes, it is necessary to correct the phase difference between the signal probes since the ports are regarded as being disposed on the same plane.

When the signal probes 415 of the RF probes 410a and 410b contact two of the terminals 401a to 401d and the initial calibration in the processing unit is completed, the RF impedance (S-parameter) starts to be measured between the selected terminals. In this embodiment, for the sake of convenience, the terminal 401a is the port 1, the terminal 401b is the port 2, the terminal 401c is the port 3 and the terminal 401d is the port 4. Through the measurement, transmission loss/transmission gain (S12, S21) and reflectance (S11, S22) are determined which are the RF impedance (S-parameter) between the ports.

When the RF impedance (S-parameter) of the package substrate 400 is measured, the distance between two of the terminals 401a (port 1) to 401d (port 4) of the package substrate 400 is determined.

In the third embodiment, the distance between two of the terminals 401a (port 1) to 401d (port 4) is obtained by contacting the signal probes 415 to the ports, and by measuring the distance between the ports using the scale (X axis) 470, scale (Y axis) 480, scale (Z axis) 460a and scale (Z axis) 460b. The phase difference in the measurement signal is obtained based on the above measured distance, so that the phase difference can be corrected for the measured RF impedance (S-parameter).

Although the scale (X axis) 470, scale (Y axis) 480, scale (Z axis) 460a and scale (Z axis) 460b in the third embodiment are manually moved as shown in FIG. 7, this stage may be controlled by a computer with an electrically-powered motor. Accordingly, the position of the signal probes 415 can be adjusted precisely and promptly to the terminals 401a (port 1) to 401d (port 4) of the package substrate 400. Also, since the distance is automatically measured between the ports when the positions of the signal probes 415 are adjusted, the phase difference can be promptly corrected for the measured RF impedance (S-parameter) Further, although the RF impedance measuring apparatus including the two RF probes is described in the third embodiment based on the second embodiment, it is also applicable to be included the four RF probes as described in the first embodiment and the number of the RF probes is not limited. Since the third embodiment is combined with the processing unit (now shown) such as a network analyzer, it is possible, as a RF impedance measuring system, to accurately measure the S-parameter for various kinds of RF apparatus that are not limited by a substrate or the like for a high frequency bandwidth.

In addition to the operational effects presented in the first and second embodiments, the phase correction with extremely easy operation can be achieved by including the scales capable of measuring the position of the RF probes in the three axis directions in the present embodiment. Consequently, applicability of the apparatus is further increased.

It should be noted that in the above embodiments, a holder (not shown) for the package substrate is used. If the holder can hold the substrate, the holder may have various shapes or structures.

What is claimed is:

1. A method of measuring RF (radio frequency) impedances, comprising:
   measuring package RF signals between terminals formed on front and back surfaces of a package substrate;
   measuring calibration RF signals between terminals formed on at least one calibration substrate;
   determining RF impedances of said package substrate from the package RF signals;
   determining phase differences corresponding to a thickness of said package substrate and distances between said terminals on the front surface or the back surface of said package substrate from the calibration RF signals; and
   calibrating said RF impedances based on said phase differences,
   wherein a processing unit is configured to measure the package RF signals between terminals formed on a package substrate, to measure the calibration RF signals between terminals formed on at least one calibration substrate, to determine the RF impedances of said package substrate from the package RF signals, and the phase differences corresponding to a thickness of said package substrate and the distances between said terminals on said package substrate from the calibration RF signals, and to calibrate said RF impedances based on said phase differences.

2. The method according to claim 1, further comprising:
   a plurality of rotation mechanisms coupled to a plurality of RF probes, respectively; and
   a mechanical controller configured to control said plurality of rotation mechanisms and said plurality of RF probes to measure the package RF signals and the calibration RF signals.

3. The method according to claim 2, wherein each of said plurality of rotation mechanisms is a 90-degree rotating mechanism,
   said impedance measuring apparatus comprises:
   first to fourth RF probes; and
   first to fourth rotation mechanisms, and
   said mechanical controller controls said first and second rotation mechanisms and said first and second probes such that said first and second probes contact two terminals of a front surface of said package substrate which is provided horizontally, and said third and fourth rotation mechanisms and said third and fourth probes such that said third and fourth probes contact two terminals of the back surface of said package substrate,
   said processing unit measures the package RF signals from said first to fourth RF probes while sequentially supplying an RF signal from each of said first to fourth RF probes,
   said mechanical controller controls said first to fourth rotation mechanisms such that said first and fourth rotation mechanisms are rotated by 90 degrees in a clockwise direction and said second and third rotation mechanisms are rotated by 90 degrees in a counter-clockwise direction,
   said processing unit measures the calibration RF signals corresponding to the thickness of said package substrate by using two calibration substrates which are provided vertically,
   said mechanical controller controls said first to fourth rotation mechanisms such that said first and fourth rotation mechanisms are rotated by 90 degrees in the counter-clockwise direction and said second and third rotation mechanisms are rotated by 90 degrees in the clockwise direction,
   said processing unit measures the calibration RF signals corresponding to the distances between the four terminals on the front and back surfaces of said package substrate by using two calibration substrates which are provided horizontally, determines RF impedances of said package substrate from the package RF signals, calculates the phase differences corresponding to the thickness of said package substrate and the distances between said four terminals on said package substrate from the calibration RF signals, and calibrates said RF impedance based on said phase differences.

4. The method according to claim 2, wherein each of said plurality of rotation mechanisms is a 180-degree rotating mechanism,
   said impedance measuring apparatus comprises:
   first and second RF probes; and
   first and second rotation mechanisms, and
   said mechanical controller controls said first and second rotation mechanisms and said first and second probes such that said first and second probes contact first and second terminals of a front surface of said package substrate which is provided horizontally,
   said processing unit measures the package RF signals between the first and second terminals,
   said mechanical controller controls said first rotation mechanism and said first probe such that said first probe contacts a third terminal of the back surface of said package substrate which is provided horizontally,
   said processing unit measures the package RF signals between the third and second terminals,
   said mechanical controller controls said second rotation mechanism and said second probe such that said second probe contacts a fourth terminal of the back surface of said package substrate which is provided horizontally,
   said processing unit measures the package RF signals between the third and fourth terminals,
   said mechanical controller controls said first rotation mechanism and said first probe such that said first probe contacts the first terminal of the front surface of said package substrate which is provided horizontally,
   said processing unit measures the package RF signals between the first and fourth terminals,
   said mechanical controller controls said first and second rotation mechanisms and said first and second probes such that said first and second probes contact first and second terminals of a front surface of said calibration substrate which is provided horizontally, said processing unit measures the calibration RF signals between the first and second terminals, said mechanical controller controls said first rotation mechanism and said first probe such that said first probe contacts a third terminal of a back surface of said calibration substrate which is provided horizontally, said processing unit measures the calibration RF signals between the third and second terminals, said mechanical controller controls said second rotation mechanism and said second probe such that said second probe contacts a fourth terminal of the back surface of said calibration substrate which is provided horizontally, said processing unit measures the calibration RF signals between the third and fourth terminals, said mechanical controller controls said first rotation mechanism and said first probe such that said first probe contacts the first terminal of the front surface of said calibration substrate which is provided horizontally, said processing unit measures the calibration RF signals between the first and fourth terminals, determines RF impedances of said package substrate from the package RF signals, calculates the phase differences corresponding to the thickness of said package substrate and the distances between said first and fourth terminals on said package substrate from the calibration RF signals, and calibrates said RF impedances based on said phase differences.

5. The method according to claim 2, further comprising:
a base;
two support mechanisms 2-dimensionally movable provided on said base;
two rotation mechanisms provided for each of said two support mechanisms; and
two RF (radio frequency) probes provided for each of said two rotation mechanisms.

6. A method of measuring RF (radio frequency) impedances, comprising:
measuring package RF signals between terminals formed on front and back surfaces of a package substrate, the front and back surfaces being on opposing sides of said package substrate and separated by a thickness of said package substrate;
measuring calibration RF signals between terminals formed on at least one calibration substrate;
determining RF impedances of said package substrate from the package RF signals;
determining phase differences corresponding to the thickness of said package substrate and distances between said terminals on the front surface or the back surface of said package substrate from the calibration RF signals; and
calibrating said RF impedances based on said phase differences.

7. The method according to claim 6, wherein said measuring package RF signals comprises:
rotating first and second rotation mechanisms by 90 degrees such that first and second probes contact two of the terminals on the front surface of said package substrate which is provided horizontally, and said third and fourth probes contact two of the terminals on the back surface of said package substrate; and measuring the package RF signals from said first to fourth RF probes while sequentially supplying an RF signal from each of said first to fourth RF probes.

8. The method according to claim 7, wherein said measuring calibration RF signals comprises:
rotating said first to fourth rotation mechanisms such that said first and fourth rotation mechanisms are rotated by 90 degrees in a clockwise direction and said second and third rotation mechanisms are rotated by 90 degrees in a counter-clockwise direction;
measuring the calibration RF signals corresponding to the thickness of said package substrate by using two calibration substrates which are provided vertically;
rotating said first to fourth rotation mechanisms such that said first and fourth rotation mechanisms are rotated by 90 degrees in the counter-clockwise direction and said second and third rotation mechanisms are rotated by 90 degrees in the clockwise direction; and
measuring the calibration RF signals corresponding to the distances between the four terminals on the front and back surfaces of said package substrate by using two calibration substrates which are provided horizontally.

9. The method according to claim 6, wherein said measuring package RF signals comprises:
(a) rotating first and second rotation mechanisms such that first and second probes contact first and second terminals of the terminals on the front surface of a target substrate which is provided horizontally;
(b) measuring RF signals between the first and second terminals;
(c) rotating said first rotation mechanism such that said first probe contacts a third terminal of the terminals on the back surface of said target substrate which is provided horizontally;
(d) measuring RF signals between the third and second terminals;
(e) rotating said second rotation mechanism such that said second probe contacts a fourth terminal of the terminals on the back surface of said target substrate which is provided horizontally;
(f) measuring RF signals between the third and fourth terminals;
(g) rotating said first rotation mechanism such that said first probe contacts the first terminal on the front surface of said target substrate which is provided horizontally;
(h) measuring RF signals between the first and fourth terminals; and
(i) carrying out the steps (a) to (h) by using said package substrate as said target substrate to get the RF signals as the package RF signals.

10. The method according to claim 9, wherein said measuring calibration RF signals comprises:
(j) carrying out the steps (a) to (h) by using said calibration substrate as said target substrate to get the RF signals as the calibration RF signals.

11. The method according to claim 6, wherein,
said step of measuring the calibration RF signals between terminals of the at least one calibration substrate, adjusts a distance between probes measuring the calibration RF signals to the thickness of said package substrate.

12. The method according to claim 6, wherein,
said step of measuring the calibration RF signals between terminals of the at least one calibration substrate, adjusts a distance between probes measuring the calibration RF signals to equal the distances between said terminals on the front surface or the back surface of said package substrate.

13. The method according to claim 6, wherein,
said step of measuring the calibration RF signals between terminals of the at least one calibration substrate, adjusts a distance between probes measuring the calibration RF signals based on the thickness of said package substrate and the distances between said terminals on the front surface or the back surface of said package substrate.

14. A method of measuring RF (radio frequency) impedances, comprising:
measuring package RF signals between terminals formed on front and back surfaces of a package substrate;
measuring calibration RF signals between terminals formed on at least one calibration substrate;
determining RF impedances of said package substrate from the package RF signals;
determining phase differences corresponding to a thickness of said package substrate and distances between said terminals on the front surface or the back surface said package substrate from the calibration RF signals; and
calibrating said RF impedances based on said phase differences,
wherein said method is carried out with an impedance measuring apparatus which corrects the phase differences in a direction of a thickness of a package substrate and in a same plane and measures the RF impedance between terminals formed on front and back surfaces of said package substrate, the apparatus comprising:
a plurality of RF probes; and
a plurality of rotation mechanisms,
wherein said plurality of RF probes are connected with said plurality of rotation mechanisms and measure the RF impedance between the terminals formed on the front and back surfaces of said package substrate on a first rotation position, and measure the phase differences corresponding to distances between the terminals in the direction of the thickness of said package substrate and in the same plane of said package substrate by using RF calibration substrates arranged in a vertical direction or in a horizontal direction to a arrangement direction of said package substrate in said first rotation position and a second rotation position, and
said impedance value is calibrated based on said phase differences.

15. The method according to claim 14, wherein said rotation mechanisms are rotatable within a 90-degree range.

16. The method according to claim 14, wherein said plurality of RF probes measure the impedance between the terminals formed on the front and back surfaces of said package substrate on a first rotation position or a second rotation position, and measure the phase differences corresponding to distances between the terminals in the direction of the thickness of said package substrate and in the same plane of said package substrate by using RF calibration substrates arranged in a vertical direction or in a horizontal direction to a arrangement direction of said package substrate in said first rotation position, a second rotation position, a third rotation position, and a fourth rotation position.

17. The method according to claim 16, wherein said rotation mechanisms are rotatable in a 180-degree range.

18. The method according to claim 14, wherein said plurality of RF probes are arranged on a 3-dimensional scale and are removable, and
the distances corresponding to inter-pin distances in the direction of the thickness of said package substrate and in the same plane between said plurality of RF probes by the 3-dimensional scale are measured.

19. The method according to claim 14, further comprising:
a RF measurement unit configured to carry out the calibration and the measurement of the RF impedance.

* * * * *